United States Patent [19]

Choi et al.

[11] Patent Number: 5,793,084
[45] Date of Patent: Aug. 11, 1998

[54] TRANSISTOR FOR PROVIDING PROTECTION FROM ELECTROSTATIC DISCHARGE

[75] Inventors: Jae Hoon Choi; Yo Hwan Koh; Hyeong Sun Hong, all of Kyoungkido, Rep. of Korea

[73] Assignee: Hyundai Electronics Industries Co., Ltd., Rep. of Korea

[21] Appl. No.: 721,796

[22] Filed: Sep. 26, 1996

[30] Foreign Application Priority Data

Sep. 28, 1995 [KR] Rep. of Korea .............. 32473

[51] Int. Cl.⁶ .................................... H01L 23/62
[52] U.S. Cl. ................ 257/360; 257/394; 257/496
[58] Field of Search ................... 257/394, 347, 257/354, 356, 360, 496

[56] References Cited

U.S. PATENT DOCUMENTS

| H1435 | 5/1995 | Cherne et al. | 257/327 |
|---|---|---|---|
| 3,440,502 | 4/1969 | Lin et al. | 257/394 |
| 4,791,071 | 12/1988 | Ang | 437/42 |
| 4,864,380 | 9/1989 | Plus et al. | 357/42 |
| 5,157,573 | 10/1992 | Lee et al. | 361/56 |
| 5,381,029 | 1/1995 | Eguchi et al. | 257/354 |
| 5,477,414 | 12/1995 | Li et al. | 361/56 |

FOREIGN PATENT DOCUMENTS 2-109369  4/1990  Japan ..................... 257/394

*Primary Examiner*—Sara W. Crane
*Attorney, Agent, or Firm*—Blakely Sokoloff Taylor & Zafman

[57] ABSTRACT

The present invention relates to a transistor for providing protection from electrostatic discharge when a semiconductor device is exposed to electrostatic state, the transistor for providing protection from Electrostatic Discharge(ESD) being characterized by the fact that in case the gate length of a transistor is L, the gate length at the edges of the transistor is longer than the gate length L, and that the gate length is fixed as L and the edge of the transistor, in which the gate is adjacent to the active regions, has a grooved shape with an acute angle, and also the present invention makes the high-intensity electric field alleviated, and also enables the current to flow uniformly over the overall gate, and the heating effect is prevented, resulting in a prolonged life expectancy of the device.

1 Claim, 5 Drawing Sheets

TRANSISTOR FOR PROVIDING PROTECTION FROM ELECTROSTATIC DISCHARGE

BACKGROUND OF THE INVENTION

1. Field of the Invention

The present invention relates to a transistor for providing protection from electrostatic discharge when a semiconductor device is exposed to electrostatic state.

2. Description of Prior Art

When a semiconductor device is, in general, exposed to electrostatic discharge, the circuits within the semiconductor device are apt to be damaged, resulting in an error during the operation of the device.

Therefore, the problem is that the device comes with a lower reliability.

The above problem comes from the fact that when the charges, injected through the internal circuits of a semiconductor device during ESD, flow into the terminal of the device, the Joule heats take place, resulting in the junction spiking and oxide film rupture.

Therefore, a semiconductor device can be protected from the ESD impact by inserting a protection circuit which enables the charges injected during the ESD impact to be leaked into the source output port before the charges flow into the internal circuits.

Referring to the attached drawings, FIG. 1 is a circuit diagram of an example for providing the ESD protection circuits, wherein a field oxide layer transistor gate 10, a resistor R and a gate oxide layer transistor 20 are shown.

FIG. 2 is a circuit diagram of another example for providing the ESD protection circuits, wherein the circuit is composed of only two gates oxide layer transistors 20.

In case electrostatic discharge takes place in an input port, most of the charges, in general leak out through a field oxide layer gate transistor and an oxide layer gate transistor.

However, unless the ESD protection circuit is designed to have a high endurance against heat, the device is more likely to be damaged because the ESD production circuit itself is apt to be broken, and the inevitable leakage currents affect the internal circuits of the semiconductor device.

FIG. 3 is a top view of a conventional gate oxide layer transistor, which may be applied to a ESD protection circuit, showing a top view of a pull-up transistor and a pull-down transistor.

In FIG. 3, the reference numeral 31 denotes an active region of a drain, 32 denotes an active region of a source, and 33 denotes a gate.

When the transistor, as shown in FIG. 3, operates at Punch Through and Bipolar Turn On, the high-intensity electric field is made due to the boundary condition between the field oxide layer 35 and the active region 34.

Hence, as shown in FIG. 4, the Joule heat due to the current crowding effect causes a fail of the device.

In FIG. 4, the reference numeral 41 denotes the active region of a drain, 42 denotes the active region of a source, and 43 denotes a gate.

SUMMARY OF THE INVENTION

To solve the foregoing problems, an object of the present invention is to provide a transistor having a high endurance against Joule heat which is caused by electrostatic discharge, by lessening the high-intensity electric field, and therefore enabling the current crowding effect to be diminished.

The invention uses a transistor for electrostatic discharge protection circuit. The transistor includes a field region, an active region surrounded by the field region and a gate electrode traversing the active region and the field region. The transistor also includes grooves formed at the active region. The grooves are positioned at a boundary between the active region and the field region, and are positioned at a portion at which the gate electrode overlaps the field region and the active region so that the grooves are positioned under the gate electrode. In this manner, the grooves formed at the active region prevent current from being concentrated at the edge of the transistor.

A further understanding of the nature and advantages of the present invention may be realized by reference to the remaining portions of the specification and the attached drawings.

DETAILED DESCRIPTION OF THE INVENTION

Figure 1:
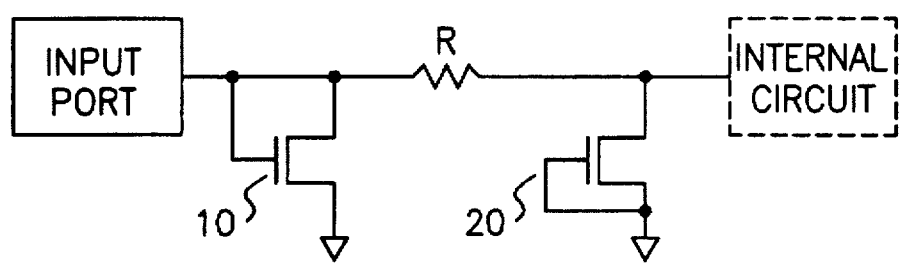
FIG. 1 is a circuit diagram illustrating an ESD protection circuit.
Figure 2:
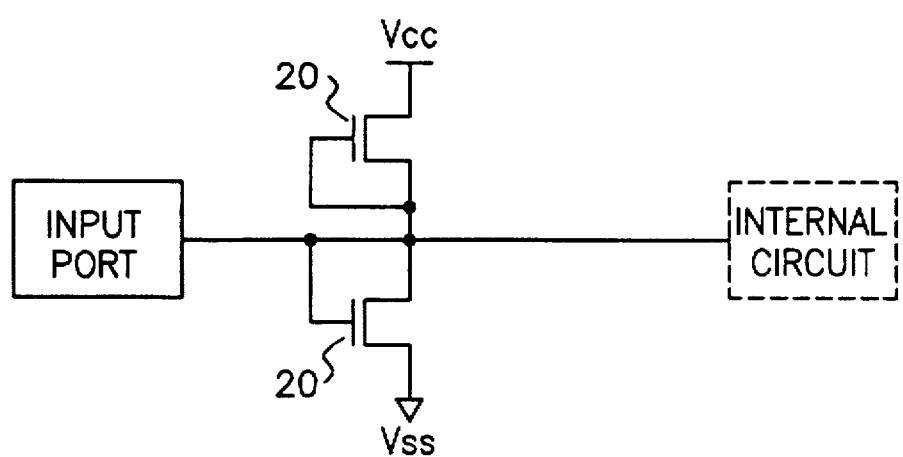
FIG. 2 is a circuit diagram illustrating another ESD protection circuit.
Figure 3:
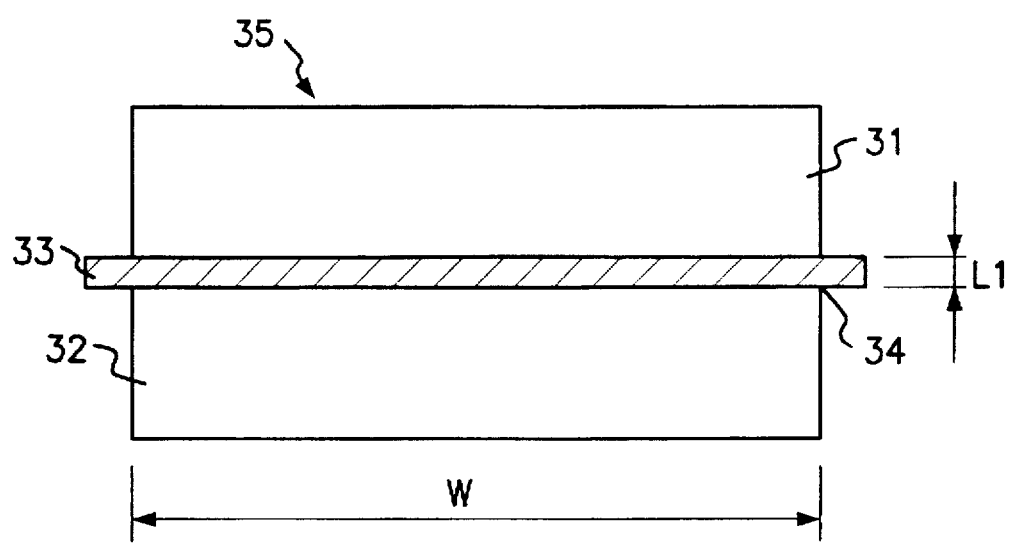
FIG. 3 is a top view of a conventional gate oxide layer transistor which is applied for an circuit for preventing ESD.
Figure 4:
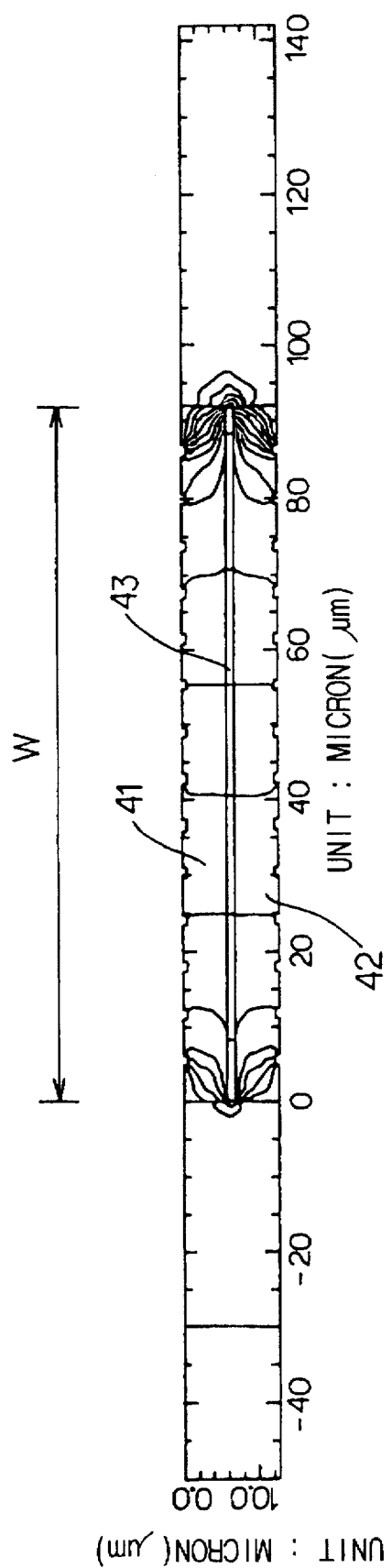
FIG. 4 is a diagram showing the result of the measurement of the current flow in FIG. 3.

Referring to the attached drawings, the present invention is fully described. First, FIG. 5 is a top view of the gate oxide layer transistor in accordance with one embodiment of the present invention, within 51 the reference numeral denotes an active region of the drain, 52 denotes an active region of the source, 53 denotes the gate, 54 denotes the boundary between the active region and the field oxide layer, and 55 denotes the field oxide region (or field region).

Figure 5:
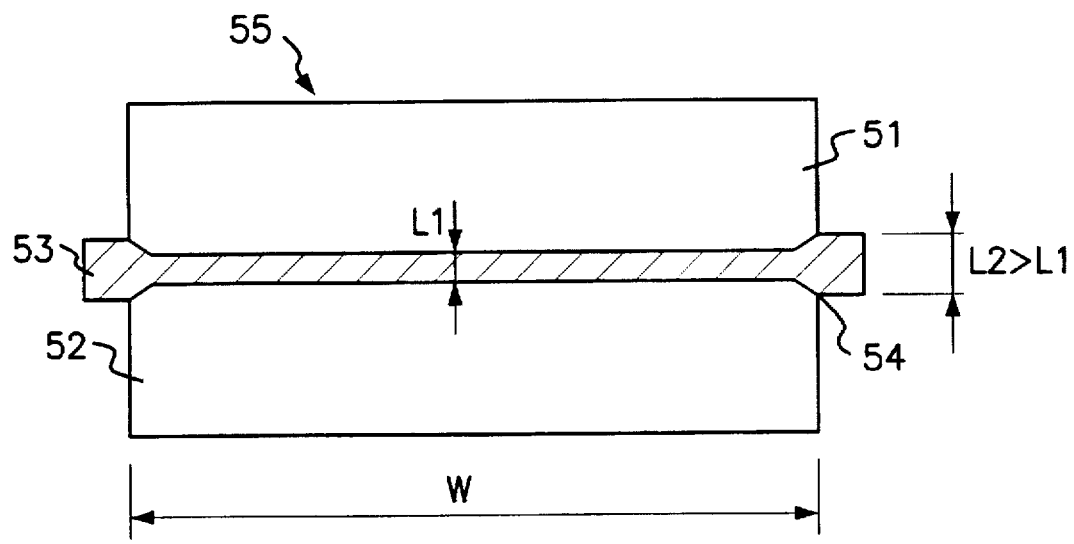
FIG. 5 is a top view of the gate oxide layer transistor in accordance with one embodiment of the present invention.

As shown in FIG. 5, the current crowding effect at the edge of the transistors can be prevented by making the gate width L1 over the active region shorter than the gate width L2 over the field region.

Either a pull-up transistor or a pull-down transistor can be used in the above-mentioned transistor for the ESD protection circuit.

Figure 6:
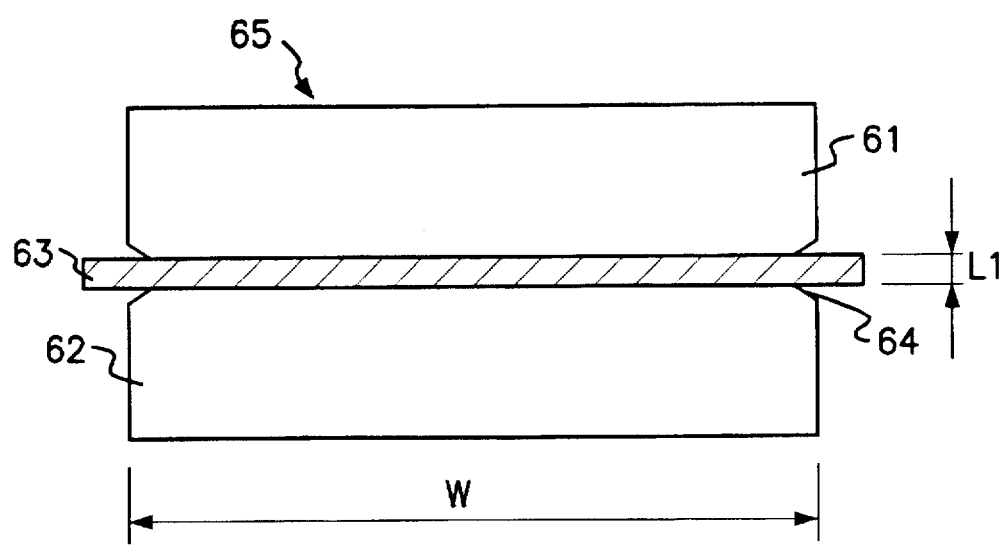
FIG. 6 is a top view of the gate oxide layer transistor in accordance with another embodiment of the present invention.

FIG. 6 is a top view of the gate oxide layer transistor in accordance with another embodiment of the present invention, the reference numeral 61 denotes the active region of the drain, 62 denotes the active region of the source, 63 denotes a gate, 64 denotes the boundary between the active region and the field oxide layer 65, respectively.

Unlike FIG. 5, in another embodiment, the gate width is fixed as L, and the edge of the transistor, (or the active region), in which the gate is adjacent to the active region, has a grooved shape with an acute angle in order to prevent the current crowding effect.

The grooves are positioned at a boundary between the active region and the field region and positioned at a portion at which the gate electrode overlaps the field region and the active region, being positioned under the gate electrode.

Figure 7:
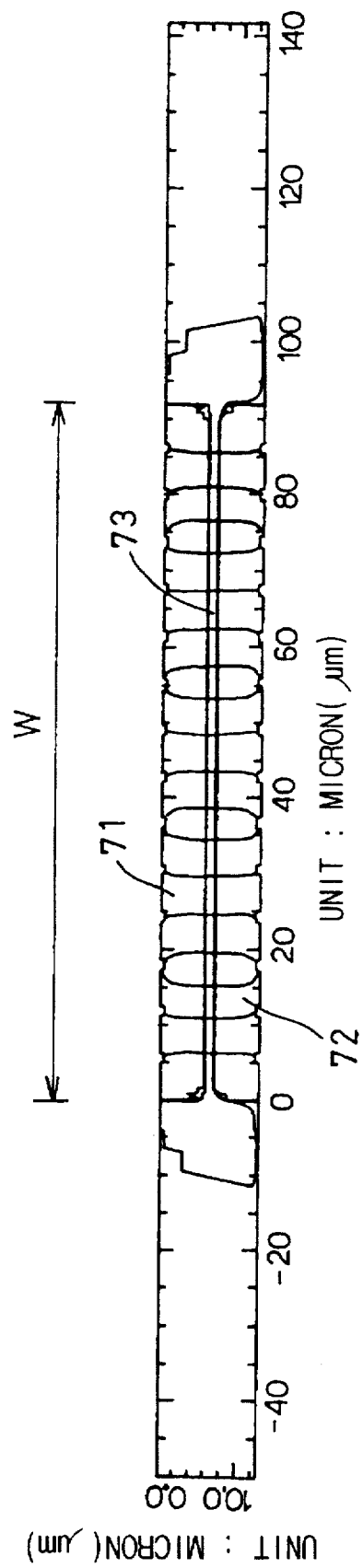
FIG. 7 is a diagram showing the result of the measurement of the current flow in accordance with the present invention.

FIG. 7 is a diagram showing the result of the measurement of the current flow in accordance with the present invention.

In FIG. 7, the reference numeral 71 denotes the active region of the drain, 72 denotes the active region of the source, and 73 denotes the gate.

As shown in FIG. 7, it can be seen that the current crowding effect does not take place, that is, the currents uniformly flows over the overall gate.

As mentioned above, the present invention alleviates the high-intensity electric field, and also enables the current to uniformly flow over the overall gate, and the heating effect is prevented, resulting in a prolonged life expectancy of the device.

The present invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed:

1. A transistor for electrostatic discharge protection circuit, wherein the transistor includes a field region, an active region surrounded by the field region and a gate electrode traversing the active region and the field region, the transistor comprising:

grooves formed at the active region, wherein the grooves are positioned at a boundary between the active region and the field region, and wherein the grooves are positioned at a portion at which the gate electrode overlaps the field region and the active region so that the grooves are positioned under the gate electrode, whereby the grooves formed at the active region prevent current from being concentrated at the edge of the transistor.

* * * * *